United States Patent
Boehm et al.

(10) Patent No.: US 12,237,844 B2
(45) Date of Patent: Feb. 25, 2025

(54) ERROR DETECTION AND CLASSIFICATION AT A HOST DEVICE

(71) Applicant: Micron Technology, Inc., Boise, ID (US)

(72) Inventors: Aaron P. Boehm, Boise, ID (US); Scott E Schaefer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 3 days.

(21) Appl. No.: 17/961,805

(22) Filed: Oct. 7, 2022

(65) Prior Publication Data

US 2024/0120947 A1    Apr. 11, 2024

(51) Int. Cl.
| | |
|---|---|
| *H03M 13/15* | (2006.01) |
| *H03M 13/00* | (2006.01) |
| *H03M 13/11* | (2006.01) |

(52) U.S. Cl.
CPC ..... *H03M 13/159* (2013.01); *H03M 13/1105* (2013.01); *H03M 13/611* (2013.01)

(58) Field of Classification Search
CPC .......... H03M 13/159; H03M 13/1105; H03M 13/611
See application file for complete search history.

(56) References Cited

U.S. PATENT DOCUMENTS

| | | | | |
|---|---|---|---|---|
| 7,587,658 | B1* | 9/2009 | Tong | G06F 11/1012 |
| | | | | 714/763 |
| 10,944,429 | B1* | 3/2021 | Yang | H03M 13/13 |
| 2002/0152444 | A1* | 10/2002 | Chen | H03M 13/151 |
| | | | | 714/785 |
| 2013/0031440 | A1* | 1/2013 | Sharon | G06F 11/1012 |
| | | | | 714/E11.032 |
| 2015/0149857 | A1* | 5/2015 | Motwani | G06F 11/1048 |
| | | | | 714/763 |
| 2017/0123882 | A1* | 5/2017 | Healy | G06F 11/0727 |
| 2017/0250714 | A1* | 8/2017 | Kim | H03M 13/458 |
| 2017/0286217 | A1* | 10/2017 | Kreifels | H03M 13/618 |
| 2019/0129791 | A1* | 5/2019 | Kreifels | G06F 11/1048 |
| 2020/0336156 | A1* | 10/2020 | Kim | H03M 13/114 |
| 2021/0248035 | A1* | 8/2021 | Eom | G06F 3/0656 |
| 2024/0118961 | A1* | 4/2024 | Boehm | G06F 11/1068 |

* cited by examiner

*Primary Examiner* — Samir W Rizk

(74) *Attorney, Agent, or Firm* — Holland & Hart LLP

(57) ABSTRACT

Methods, systems, and devices for error detection and classification at a host device are described. A host device may communicate a read command for a codeword stored at a memory device. In response to communicating the read command, the host device may receive the codeword and an error indication bit that indicates whether the memory device detected an error in the codeword. The host device may use the codeword to generate a set of syndrome bits. The host device may determine an error status of the codeword based on the error indication bit for the codeword and the set of syndrome bits for the codeword.

24 Claims, 9 Drawing Sheets

ERROR DETECTION AND CLASSIFICATION AT A HOST DEVICE

FIELD OF TECHNOLOGY

The following relates to one or more systems for memory, including performing error detection and classification.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
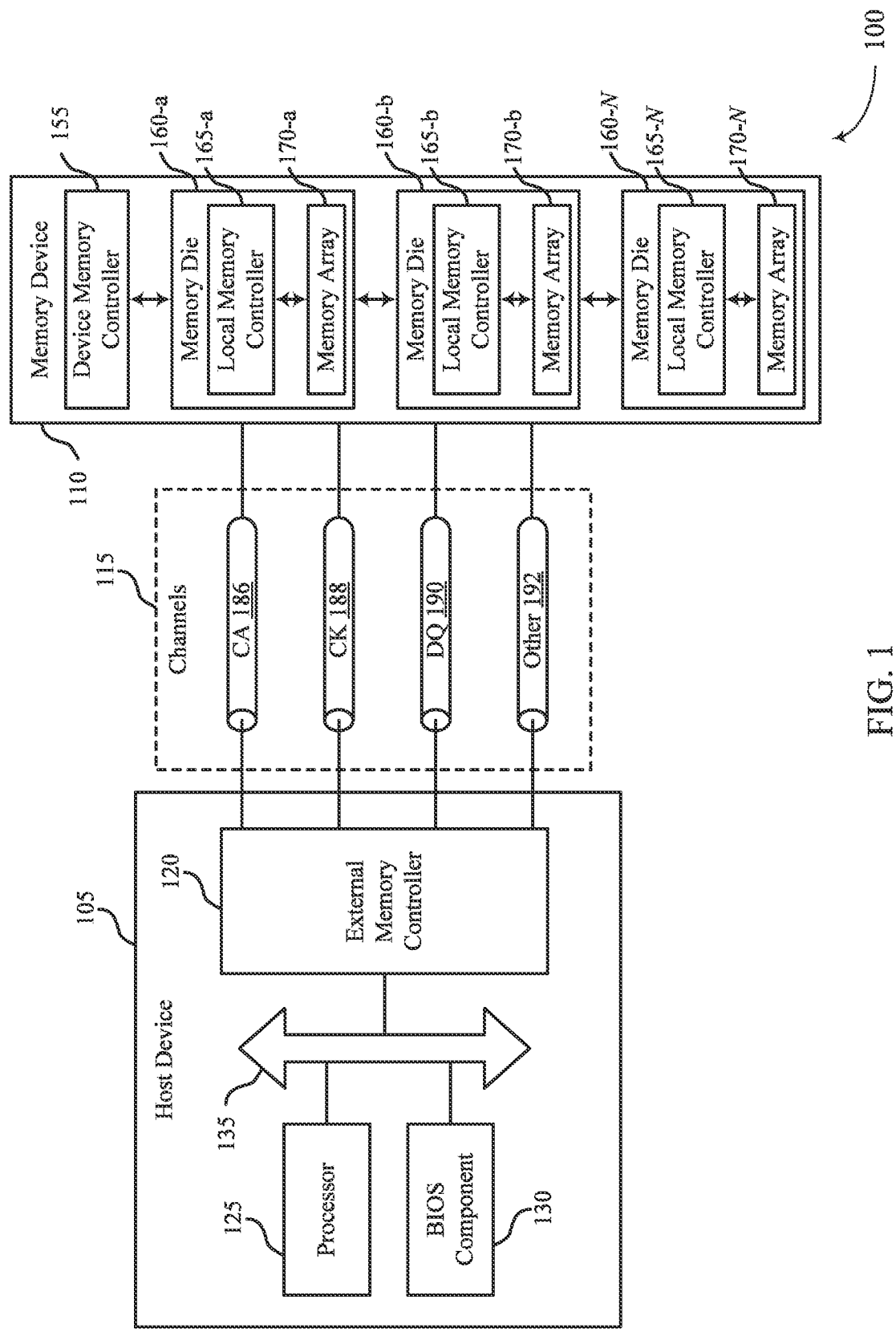
FIG. 1 illustrates an example of a system that supports error detection and classification in accordance with examples as disclosed herein.

A system may include a host device (e.g., a processing device) and a memory device that stores information for the host device. To detect and potentially correct errors in the information (e.g., codewords) stored in the memory device, a memory system may implement an error detection and correction scheme (e.g., an error correction code (ECC)). But the system may be limited in its ability to classify the various types of errors that can arise as the system operates (e.g., correctable errors versus uncorrectable errors, array errors versus link errors). In certain higher-reliability systems (e.g., in automotive safety), techniques for determining an error status of information be desired (e.g., so that the host device can use the error status to determine subsequent behavior).

According to the techniques described herein, a system may determine the error status for codewords that are read from a memory device and communicated to a host device.

In a first technique, the memory device may generate two or more error detection bits that, together, indicate the error status of a codeword. For example, the memory device may generate a first set of syndrome bits for a codeword that may be used to generate a first error detection bit that indicates whether there is an error in the codeword. The memory device may also generate a second set of syndrome bits for the codeword that are used to generate a second error detection bit that indicates whether there is a different error in the codeword. Together, the error detection bits may indicate whether the error status of the codeword (such as whether the codeword is error-free), whether the codeword has a corrected error, or whether the codeword has an uncorrectable error.

In a second technique, the host device may receive from the memory device an error detection bit that indicates whether the memory device detected a first type of error (e.g., an array error) in the codeword. In a first option, the host device may generate syndrome bits for the codeword that indicate whether the codeword has a second type of error (e.g., a link error), and may use the syndrome bits, along with the error detection bit, to determine the error status of the codeword. In a second option, the host device may generate a second error detection bit for the codeword that indicates whether the codeword has a second type of error (e.g., a link error), and may use both error detection bits to determine the error status of the codeword.

In various systems, such as higher-reliability systems (e.g., in automotive safety), techniques for determining the error status of information in accordance with this disclosure provide various advantages, such as the host device being able to use the error status to determine subsequent behavior, among other examples.

Features of the disclosure are initially described in the context of a system as described with reference to FIG. 1. Features of the disclosure are described in the context a memory device and a process flow as described with reference to FIGS. 2 and 3. Features of the disclosure are described in the context a host device and a process flow as described with reference to FIGS. 4 through 6. These and other features of the disclosure are further illustrated by and described with reference to an apparatus diagram and flowcharts that relate to error detection and classification as described with reference to FIGS. 7 through 9.

FIG. 1 illustrates an example of a system 100 that supports error detection and classification in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-$a$, memory die 160-$b$, memory die 160-N) may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory device may use an error correction technique to detect and potentially correct errors in information stored in the memory device. For example, a memory device may use an ECC scheme to detect and correct errors that arise in stored codewords. A codeword may refer to a combination of data bits and parity bits that are generated based on the data bits. For example, each parity bit in a codeword may be generated based on or by performing a logic operation (e.g., an exclusive-OR (XOR) operation) on a subset of the data bits according to the error correction code. But the ECC scheme may not provide comprehensive information about the error status of codewords.

To enable improved detection and classification of errors, the memory system 100 may implement a memory-centric technique or a host-centric technique (both of which may involve operations by a memory device and a host device).

In the memory-centric technique, the memory device 110 may decode a codeword and generate an error detection bit that indicates whether an error has been detected in the codeword. According to the memory-centric technique, the memory device 110 may correct any errors detected in the codeword (e.g., up to the limit of the ECC power) and then generate a second error detection bit that indicates whether any other errors have been detected in the codeword. The memory device may communicate to the host device 105 the codeword and the two error detection bits, which together may indicate the error status of the codeword, so that the host device 105 can initiate or perform an action based on the error status of the codeword.

In the host-centric technique, the memory device 110 may generate a single error detection bit that is communicated to the host device 105 along with the codeword. The error detection bit may indicate whether the memory device 110 detected a first type of error (e.g., an array error) in the codeword. An array error may refer to an error that is associated with storage of the codeword in memory (e.g., an error that originates while the codeword is in memory).

In a first option for the host-centric technique, the host device 105 may A) receive an error detection bit that indicates whether a codeword had a first type of error (e.g., an array error), and B) determine syndrome bits for the codeword that indicate whether the codeword has a second type of error (e.g., a link error). A link error may refer to an error that is associated with propagation of the codeword between the memory device 110 and the host device 105 (e.g., an error that originates while the codeword is communicated between the memory device 110 and the host device 105). The host device 105 may then use the error detection bit and the syndrome bits to determine the error status of the codeword.

In a second option for the host-centric technique, the host device 105 may A) receive a first error detection bit that indicates whether a codeword had a first type of error (e.g., an array error), and B) use the received codeword to generate a second error detection bit that indicates whether the codeword has the second type of error (e.g., a link error). The host device 105 may then use the second error detection bit, along with the first error detection bit, to determine the error status of the codeword.

The types of errors detectable by the memory-centric technique may vary somewhat relative to the type of errors detectable by the memory centric technique. For example, the memory-centric technique may enable determination of whether a codeword is errorless, whether the codeword had a correctable array error, or whether the codeword has an uncorrectable error, or any combination thereof, among other statuses and combinations. The host-centric technique may enable determination of whether a codeword is error-free, whether the codeword has an uncorrectable error or unknown origin, whether the codeword has an uncorrectable link error, whether the codeword has a correctable array error, or whether the codeword has a correctable link error, or any combination thereof, among other possible statuses and combinations.

Figure 2:
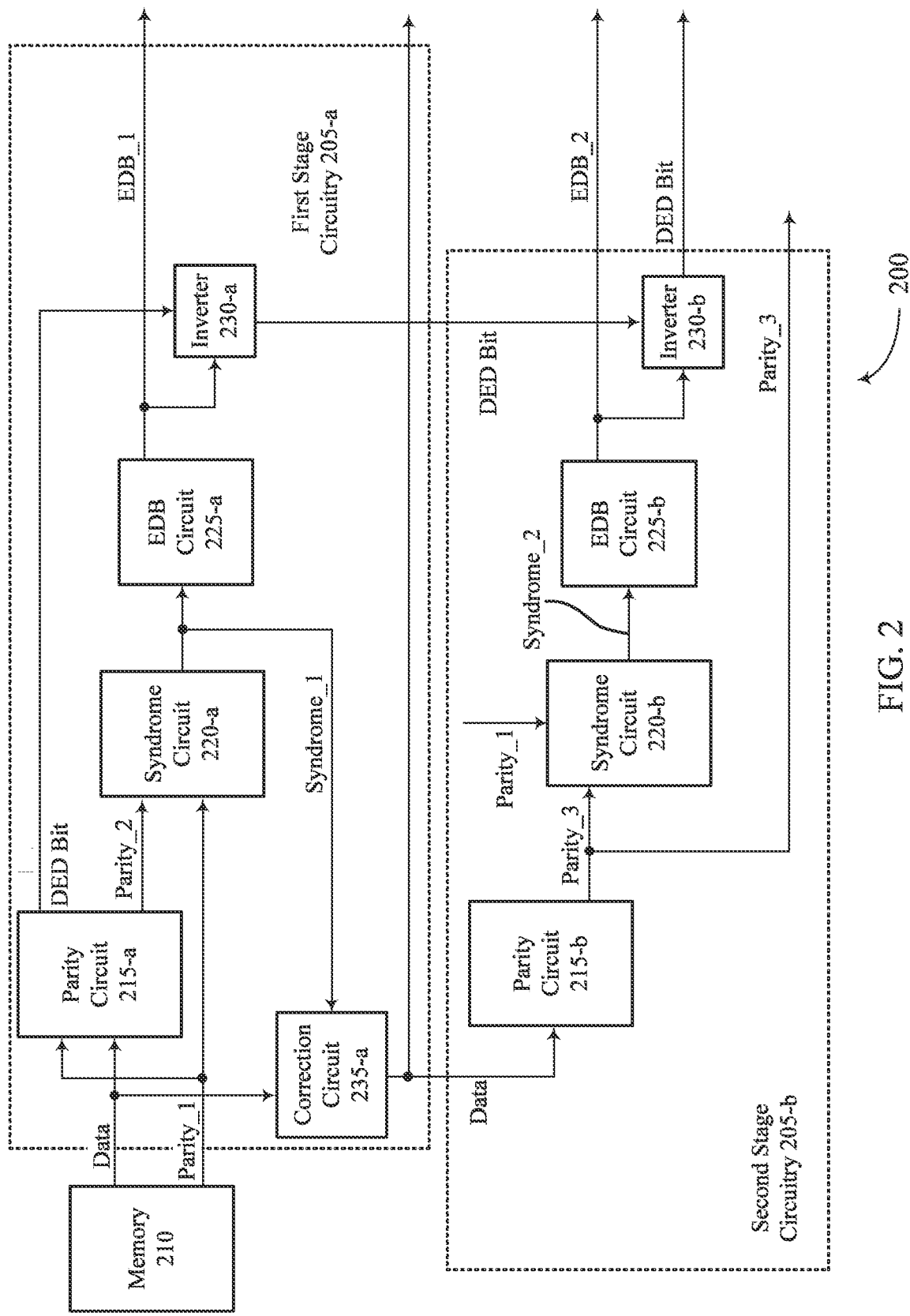
FIG. 2 illustrates an example of a memory device that supports error detection and classification in accordance with examples as disclosed herein.

FIG. 2 illustrates an example of a memory device 200 that supports error detection and classification in accordance with examples as disclosed herein. The memory device 200 may be configured to implement aspects of the memory-centric technique. The memory device 200 may include a memory 210 that is configured to store information, such as codewords. The memory device 200 may include first stage circuitry 205-a that generates a first error detection bit and second stage circuitry 205-b that generates a second error detection bit. The memory device 200 may include one or more buses, interfaces, traces, and/or pins (e.g., nodes, terminals) that are configured to convey the error detection bits to a host device so that the host device can initiate or perform an appropriate action.

At a high level, the first stage circuitry 205-a may generate a first set of parity bits for a codeword so that the first set of parity bits can be used, along with a second set of parity bits included in the codeword, to generate a first set of syndrome bits for the codeword. The first stage circuitry 205-a may then use the first set of syndrome bits to A) generate a first error detection bit (EDB_1) and B) potentially correct an error in the codeword. The second stage circuitry 205-b may generate a third set of parity bits for a codeword so that the third set of parity bits can be used, along with a second set of parity bits included in the codeword, to generate a seconds et of syndrome bits for the codeword. The second stage circuitry 205-b may then use the second set of syndrome bits to generate a second error detection bit (EDB_2).

The parity circuit 215-a may receive a codeword read from the memory 210. The codeword may include data bits and a first set of parity bits (Parity_1). The parity circuit 215-a may generate a second set of parity bits (Parity_2) for the codeword. The second set of parity bits may be generated based on the data bits in the codeword (e.g., by performing a logic operation, such as an XOR operation, of the data bits). In some examples, the parity circuit 215-a may generate a double-error-detection (DED) bit for the codeword that indicates whether the codeword has an even quantity of logic 1s or an odd quantity of logic is. The DED bit may be generated based on the data bits in the codeword and the parity bits in the codeword (e.g., the first set of parity bits (Parity_1)). In some examples, the parity circuit 215-a may be a logic circuit.

The DED bit may be used (e.g., by the host device) to detect double-bit errors in the codeword. For example, if the syndrome bits for the codeword are non-zero and the DED bit is incorrect, it may be determined that the codeword has a correctable single-bit error. If the syndrome bits for the codeword are non-zero and the DED bit is correct, it may be determined that the codeword has an uncorrectable double-bit error. The DED bit may be referred to as an extra parity bit or other suitable terminology.

The syndrome circuit 220-a may receive the first set of parity bits (Parity_1) and the second set of parity bits (Parity_2) and generate a first set of syndrome bits (Syndrome_1) based on the first set of parity bits (Parity_1) and the second set of parity bits (Parity_2). For example, the syndrome circuit 220-a may XOR each parity bit in the first set of parity bits (Parity_1) with a corresponding parity bit in the second set of parity bits (Parity_2). To illustrate, a first syndrome bit (S0) may be generated by XORing the first parity bit (P0) in the first set of parity bits and the first parity bit (P0) in the second set of parity bits, a second syndrome bit (S1) may be generated by XORing the second parity bit (P1) in the first set of parity bits and the second parity bit (P1) in the second set of parity bits, and so on and so forth. If the codeword has an error the first set of syndrome bits (Syndrome_1) may be non-zero; if the codeword is errorless the first set of syndrome bits may be zeros. In some examples, the syndrome circuit 220-a may be a logic circuit.

Figure 5:
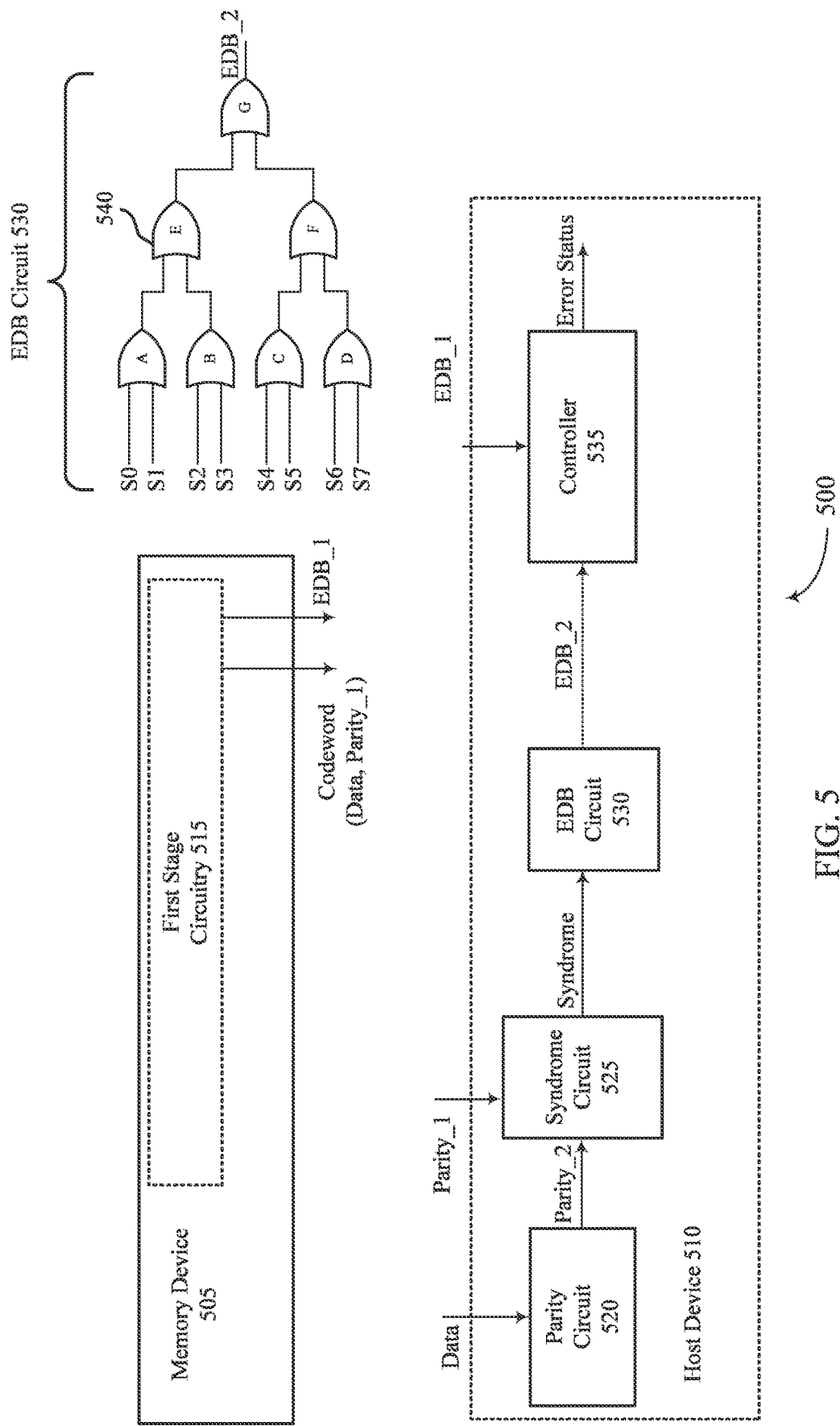
FIG. 5 illustrates an example of a system that supports error detection and classification in accordance with examples as disclosed herein.

The EDB circuit 225-a may generate a first error detection bit (EDB_1) that indicates whether an error has been detected in the codeword. The EDB circuit 225-a may generate the first error detection bit (EDB_1) based on the first set of syndrome bits (Syndrome_1). For example, the EDB circuit 225-a may generate the first error detection bit by ORing the first set of syndrome bits. An example of the EDB circuit 225-a is shown in FIG. 5. In some examples, the EDB circuit 225-a may be referred to as a syndrome check circuit. The first error detection bit may be a logic 0 (EDB_1=0) if the codeword is errorless and may be a logic 1 (EDB_1=1) if the codeword has an error. In some examples, the EDB circuit 225-a may be a logic circuit.

The inverter 230-a may receive the DED bit from the parity circuit 215-a and may invert the DED bit based on the first error detection bit received from the EDB circuit 225-a. For example, if the first error detection bit indicates that the codeword has an error (e.g., if EDB_1=1), the inverter 230-a may invert the DED bit. Inversion of the DED bit may ensure consistency between the DED bit and the codeword after the codeword is corrected by the correction circuit 235-a. If the first error detection bit indicates that the codeword is errorless (e.g., if EDB_1=0), the inverter 230-a may not invert the DED bit. The DED bit may be communicated to the inverter 230-b for possible inversion (based on the second error detection bit) before the memory device 200 communicates the DED bit to the host device.

The correction circuit 235-a may receive the codeword from the memory 210 and may correct an error detected in the codeword (if an error exists). The correction circuit 235-a may perform codeword correction based on the first set of syndrome bits, which may not only indicate whether there is an error in the codeword but also the location of the error as well. Correcting an error may refer to inverting the bit that has the error. So, correction of the codeword may occur outside of the memory 210 (e.g., at one or more components separate from the memory 210 such as the correction circuit 235-a). If the codeword is errorless, the correction circuit 235-a may communicate the codeword to the second stage circuitry 205-b without performing any correction on the codeword.

The parity circuit 215-b may receive the (potentially corrected) codeword from the correction circuit 235-a. The parity circuit 215-b may generate a third set of parity bits (Parity_3) for the codeword. The third set of parity bits may be generated based on the data bits in the codeword (e.g., by performing a logic operation, such as an XOR operation, of the data bits). In some examples, the parity circuit 215-*a* may be a logic circuit. The third set of parity bits may be communicated to the host device so that the host device can detect a single-bit link error in the codeword that arises during propagation of the codeword between the memory device 200 and the host device.

The syndrome circuit 220-*b* may receive the first set of parity bits (Parity_1) and the third set of parity bits (Parity_3) and generate a second set of syndrome bits (Syndrome_2) based on the first set of parity bits and the third set of parity bits. For example, the syndrome circuit 220-*a* may XOR each parity bit in the first set of parity bits with a corresponding parity bit in the third set of parity bits. If the codeword has an error the second set of syndrome bits (Syndrome_2) may be non-zero; if the codeword is errorless the second set of syndrome bits may be zeros. In some examples, the syndrome circuit 220-*b* may be a logic circuit.

The EDB circuit 225-*b* may generate a second error detection bit (EDB_2) that indicates whether an error has been detected in the codeword. The EDB circuit 225-*b* may generate the second error detection bit (EDB_2) based on the second set of syndrome bits (Syndrome_2). For example, the EDB circuit 225-*a* may generate the second error detection bit by ORing the second set of syndrome bits. The second error detection bit may be a logic 0 (EDB_2=0) if the codeword is errorless and may be a logic 1 (EDB_2=1) if the codeword has an error. In some examples, the EDB circuit 225-*b* may be a logic circuit.

The inverter 230-*b* may receive the DED bit from the inverter 230-*a* and may invert the DED bit based on the second error detection bit received from the EDB circuit 225-*b*. For example, if the second error detection bit indicates that the codeword has an error (e.g., if EDB_2=1), the inverter 230-*b* may invert the DED bit. Inversion of the DED bit may ensure consistency between the DED bit and the codeword. If the second error detection bit indicates that the codeword is errorless (e.g., if EDB_2=0), the inverter 230-*b* may not invert the DED bit. The DED bit may be communicated to the host device so that the host device can detect a double-bit in the codeword that arises during propagation of the codeword between the memory device 200 and the host device.

A device (e.g., the memory device 200, the host device) may determine the error status of a codeword based on the error detection bits for the codeword. For example, the device may use Table 1 to determine the error status of the codeword. According to Table 1, the device may determine that the codeword is errorless if EDB_1=0 and EDB_2=0; the device may determine that the codeword has an uncorrectable error if EDB_1=0 and EDB_2=1 or if EDB_1=1 and EDB_2=1; and the device may determine that the codeword has a correctable array error (e.g., a single bit error) if EDB_1=1 and EDB_2=0.

TABLE 1

Error Status Mapping for Memory-Centric Technique

| EDB_1 | EDB_2 | Error Status |
|---|---|---|
| 0 | 0 | Errorless |
| 0 | 1 | Uncorrectable error |
| 1 | 0 | Corrected array error |
| 1 | 1 | Uncorrectable error |

In addition to communicating a codeword to the host device, the memory device 200 may communicate or otherwise provide an indication of the error status of the codeword to the host device. In some examples, the memory device 200 may provide the error status by writing the error status to one or more mode registers at the memory device 200 for the host device to read. In other examples, the memory device 200 may provide the error status(es) by writing the error detection bits to one or more mode registers at the memory device 200 for the host device to read. The host device may read the mode register(s) periodically or in response to a trigger condition (e.g., receipt of a prompt from the memory device 200).

In some examples, the memory device 200 may provide the error status(es) by transmitting the error status(es) to the host device (e.g., via a communication bus between the memory device 200 and the host device). In other examples, the memory device 200 may provide the error status(es) by transmitting the error detection bits to the host device (e.g., via a communication bus between the memory device 200 and the host device).

The host device may receive or read the error status of the codeword (or the error detection bits for the codeword) and determine the error status of the codeword accordingly. In some examples, the host device may initiate or perform one or more actions based on the error status of the codeword. For instance, if the error status indicates that the data received by the host device is errorless, the host device may process the data.

If the error status indicates that the received data has an error (e.g., an uncorrectable error), the host device may discard the data and enter a safety mode. For example, if the host device is part of a self-driving vehicle, the host device may cause the vehicle to A) slow down and/or pull over to the side of the road or B) transfer control of the vehicle to the driver.

If the error status indicates that the codeword had a correctable error that the memory device 200 corrected, the host device may record the address associated with that codeword as part of an error-logging process for ensuring the reliability of the memory device 200. For example, the host device may retire (e.g., no longer use) a portion (e.g., a row) of memory if a threshold quantity of errors accumulate in the row. Other actions by the host device are contemplated and within the scope of the present disclosure.

Thus, a system may implement the memory-centric technique to detect and classify errors in a codeword.

Figure 3:
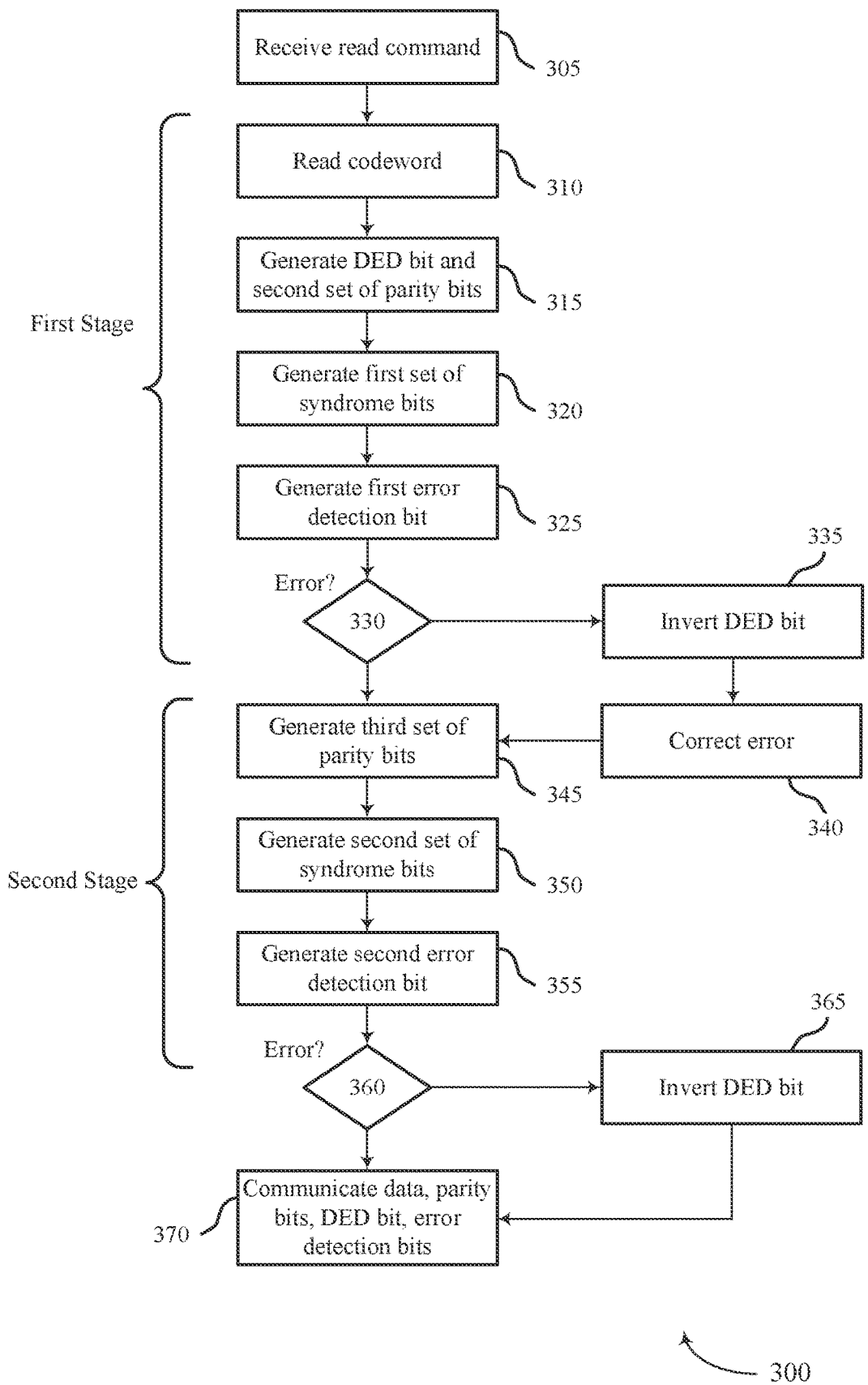
FIG. 3 illustrates an example of a process flow that supports error detection and classification in accordance with examples as disclosed herein.

FIG. 3 illustrates an example of a process flow 300 that supports error detection and classification in accordance with examples as disclosed herein. Aspects of the process flow 300 may be implemented by a memory device as described herein. For example, aspects of the process flow 300 may be implemented by the memory device 200 as described with reference to FIG. 2, which may be configured to support the memory-centric technique. By implementing aspects of the process flow 300, the memory device may generate error detection bits that indicate the error status for a codeword associated with data requested by a host device. The process flow 300 may include operations performed by the first stage circuitry 205-*a* (labeled "first stage" in FIG. 3) and operations performed by the second stage circuitry 205-*b* (labeled "second stage" in FIG. 3).

At 305, the memory device may receive (e.g., from the host device) a read command for the data. At 310, the memory device may read the codeword associated with the data from a memory (e.g., the memory 210). The memory device may read the codeword based on (e.g., in response to) the read command. The codeword may include the data and a first set of parity bits (e.g., Parity_1) for the data.

At 315, the memory device may generate (e.g., via the parity circuit 215-a) a DED bit and a second set of parity bits (e.g., Parity_2) for the codeword. The DED bit may be generated based on the codeword (e.g., the data bits and the parity bits). The second set of parity bits may be generated based on the data bits in the codeword.

At 320, the memory device may generate (e.g., via the syndrome circuit 220-a) a first set of syndrome bits (e.g., Syndrome_1) for the codeword. The first set of syndrome bits may be generated based on the first set of parity bits and the second set of parity bits.

At 325, the memory device may generate (e.g., via the EDB circuit 225-a) a first error detection bit (e.g., EDB_1) for the codeword. The first error detection bit may be generated based on the first set of syndrome bits for the codeword.

At 330, the memory device may determine whether the codeword has an error. If the memory device determines that the codeword has an error, the memory device may, at 335, invert (e.g., via the inverter 230-a) the DED bit. The memory device may also, at 340, correct (e.g., via the correction circuit 235-a) the error in the in the codeword.

At 345, the memory device may generate (e.g., via the parity circuit 215-b) a third set of parity bits (e.g., Parity_3) for the codeword. The third set of parity bits may be generated based on the data bits from the correction circuit 235-a.

At 350, the memory device may generate (e.g., via the syndrome circuit 220-b) a second set of syndrome bits (e.g., Syndrome_2) for the codeword. The second set of syndrome bits may be generated based on the first set of parity bits and the third set of parity bits.

At 355, the memory device may generate (e.g., via the EDB circuit 225-b) a second error detection bit (e.g., EDB_2) for the codeword. The second error detection bit may be generated based on the second set of syndrome bits for the codeword.

At 360, the memory device may determine whether the codeword has an error. If the memory device determines that the codeword has an error, the memory device may, at 365, invert (e.g., via the inverter 230-b) the DED bit.

At 370, the memory device may communicate to the host device (e.g., via one or more pins) one or more of the data bits, the third set of parity bits, the DED bit, or the error detection bits.

Thus, the memory device may generate error detection bits that indicate the error status for the codeword. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 4:
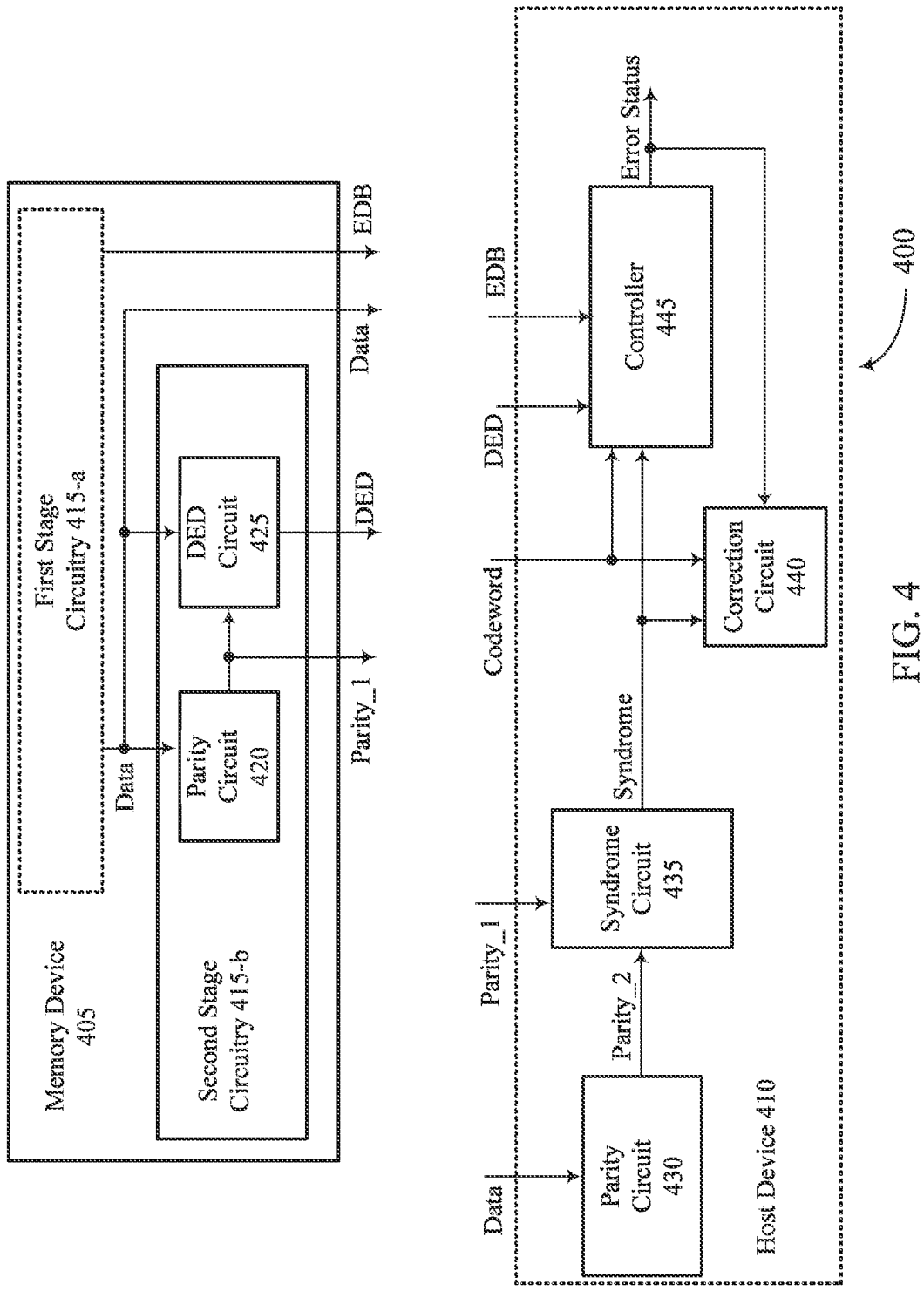
FIG. 4 illustrates an example of a system that supports error detection and classification in accordance with examples as disclosed herein.

FIG. 4 illustrates an example of a system 400 that supports error detection and classification in accordance with examples as disclosed herein. The system 400 may include a memory device 405 and a host device 410. The system 400 may be configured to implement aspects of the first option for the host-centric technique. In some examples, the first option may be implemented if the system 400 is operating in an error correction mode in which ECC is enabled and used to correct single-bit link errors.

At a high level, the memory device 405 may include first stage circuitry 415-a that generates an error detection bit (EDB) and second stage circuitry 415-b that generates parity bits and a DED bit for the codeword. The host device 410 may use the codeword received from the memory device (and parity bits generated by the host device 410) to generate syndrome bits that the host device 410 uses, along with the error detection bit, to determine the error status of the codeword.

The memory device 405 may be similar to the memory device 200 with at least one difference being that the memory device 405 may omit various components (e.g., the syndrome circuit 220-b, the EDB circuit 225-b, the inverter 230-b). The memory device 405 may include a memory that is configured to store information, such as codewords. The first stage circuitry 415-a may be similar to the first stage circuitry 205-a and may be configured to generate an error detection bit that indicates whether a first type of error (e.g., an array error) has been detected in a codeword read from the memory. The error detection bit may be generated on a first set of syndrome bits for the codeword. The first stage circuitry 415-a may also detect and correct an array error in the codeword (if one exists) based on a first set of syndrome bits for the codeword, which may be generated based on a first set of parity bits included in the codeword and a second set of parity bits generated by the first stage circuitry 415-a.

The second stage circuitry 415-b may include a parity circuit 420 configured to generate a third set of parity bits (Parity_1) that enable detection of link errors by the host device 410. The second stage circuitry 415-b may also include a DED circuit 425 configured to generate a DED bit for the codeword based on the data bits in the codeword and the third set of parity bits generated by the parity circuit 420. Although shown separately, the DED circuit 425 may be included in the parity circuit 420.

The memory device 405 may communicate various information to the host device 410 to enable error status determination by the host device 410. For example, the memory device 405 may communicate the codeword (e.g., the data bits and the third set of parity bits (Parity_1)), the DED bit, the error detection bit, other information, or any combination thereof. The information communicated to the host device 410 may be conveyed via one or more buses, pins, interfaces, traces, registers, or the like, coupled with the memory device 405 and the host device 410.

The parity circuit 430 may receive the data bits of the codeword from the memory device 405. The parity circuit 430 may generate a fourth set of parity bits (Parity_2) that enable detection of link errors by the host device 410. The fourth set of parity bits may be generated based on the data bits in the codeword (e.g., by performing a logic operation, such as an XOR operation, of the data bits). In some examples, the parity circuit 430 may a be a logic circuit.

The syndrome circuit 435 may receive the third set of parity bits (Parity_1) and the fourth set of parity bits (Parity_2) and generate a second set of syndrome bits (Syndrome) based on the third set of parity bits and the fourth set of parity bits. For example, the syndrome circuit 435 may XOR each parity bit in the third set of parity bits with a corresponding parity bit in the fourth set of parity bits. The syndrome bits may indicate whether the codeword has a second type of error (e.g., a link error).

The controller 445 may determine the error status of the codeword based on the syndrome bits, the DED bit, and the error detection bit. For example, the controller 445 may use error detection bit to determine whether the codeword had a correctable array error and may use the syndrome bits and the DED bit to determine whether the codeword has a single-bit link error, a double-bit link error (e.g., two link errors), or a multi-bit link error (e.g., three or more link errors).

In some examples, the host device 410 may use Table 2 to determine the error status of the codeword. According to Table 2, the host device may determine that the codeword is errorless if EDB=0 and the codeword is free of link errors; the host device may determine that the codeword has an uncorrectable link error if EDB=0 and the codeword has a double-bit link error or a multi-bit link error; the host device may determine that the codeword has a correctable link error if EDB=0 and the codeword has a single-bit link error; the host device may determine that the codeword had a corrected array error if EDB=1 and the codeword is free of link errors; and the host device may determine that the codeword has an uncorrectable error if EDB=1 and the codeword has one or more link errors.

TABLE 2

Error Status Mapping for Host-Centric Technique, First Option

| EDB | Link SBE | Link DBE | Link MBE | Error Status |
|-----|----------|----------|----------|--------------|
| 0 | No | No | No | Errorless |
| 0 | No | No | Yes | Uncorrectable link error |
| 0 | No | Yes | No | Uncorrectable link error |
| 1 | Yes | No | No | Correctable link error |
| 1 | No | No | No | Corrected array error |
| 1 | No | No | Yes | Uncorrectable error |
| 1 | No | Yes | No | Uncorrectable error |
| 1 | Yes | No | No | Uncorrectable error |

The correction circuit 440 may receive the codeword and correct a link error (e.g., a single-bit link error, if one exists) in the codeword based on the syndrome bits and the error status from the controller 445. For example, the correction circuit 440 may correct a single-bit link error in the codeword if the syndrome bits indicate the single-bit link error and the error status indicates that the codeword has a correctable link error. However, the correction circuit 440 may not correct the codeword (even if the syndrome bits indicate a single-bit link error) if the error status indicates that the codeword has an uncorrectable error (link or otherwise). Alternatively, the correction circuit 440 may correct a link error in the codeword based on the syndrome bits and the DED bit.

The host device 410 may initiate or perform one or more actions based on the error status of the codeword. For example, if the error status indicates that the data received by the host device 410 is errorless, the host device may process the data. If the error status indicates that the received data has an uncorrectable error (e.g., two or more errors), the host device 410 may discard the data and enter a safety mode. If the error status indicates that the codeword had a correctable array error (e.g., a single-bit error) that the memory device 405 corrected, the host device 410 may record the address associated with that codeword as part of an error-logging process for ensuring the reliability of the memory device 405. For example, the host device 410 may retire (e.g., no longer use) a portion (e.g., a row) of memory if a threshold quantity of errors accumulate in the row. If the error status indicates that the received data has a correctable link error (e.g., a single-bit error), the host device 410 may correct the error and process the data. If the error status indicates that the received data has an uncorrectable link error, the host device 410 may re-transmit the read command for the data. Other actions by the host device are contemplated and within the scope of the present disclosure.

Thus, the system 400 may implement the first option for the host-centric technique to detect and classify errors in a codeword.

FIG. 5 illustrates an example of a system 500 that supports error detection and classification in accordance with examples as disclosed herein. The system 500 may include a memory device 505 and a host device 510. The system 500 may be configured to implement aspects of the second option for the host-centric technique. In some examples, the second option may be implemented if the system 500 is operating in an error detection mode in which ECC is disabled or unavailable for correcting single-bit link errors.

At a high level, the memory device 505 may include first stage circuitry 515 that outputs A) a codeword requested by the host device and B) a first error detection bit (EDB_1) for the codeword. The host device 510 may use the codeword received from the memory device (and parity bits generated by the host device 510) to generate a second error detection bit (EDB_2) that the host device 510 uses, along with the first error detection bit, to determine the error status of the codeword.

The memory device 505 may be similar to the memory device 405 with at least one difference being that the memory device 505 may omit various components (e.g., the second stage circuitry 415-b). The memory device 505 may include a memory that is configured to store information, such as codewords. The first stage circuitry 515 may be similar to the first stage circuitry 415-a and may be configured to generate a first error detection bit (EDB_1) that indicates whether a first type of error (e.g., an array error) has been detected in a codeword read from the memory. The error detection bit may be generated on a first set of syndrome bits for the codeword. The first stage circuitry 515 may also detect and correct an array error in the codeword (if one exists) based on a first set of syndrome bits for the codeword, which may be generated based on a first set of parity bits included in the codeword (Parity_1) and a second set of parity bits generated by the first stage circuitry 515.

The memory device 505 may communicate various information to the host device 510 to enable error status determination by the host device 510. For example, the memory device 505 may communicate the codeword (e.g., the data bits and the first set of parity bits (Parity_1) or the second set of parity bits), the first error detection bit (EDB_1), other information, or any combination thereof. The information communicated to the host device 510 may be conveyed via one or more buses, pins, interfaces, traces, registers, or the like, coupled with the memory device 505 and the host device 510.

The parity circuit 520 may receive the data bits of the codeword from the memory device 505. The parity circuit 520 may generate a third set of parity bits (Parity_2) that enable detection of link errors by the host device 510. The third set of parity bits may be generated based on the data bits in the codeword (e.g., by performing a logic operation, such as an XOR operation, of the data bits). In some examples, the parity circuit 520 may a be a logic circuit.

The syndrome circuit 525 may receive the first set of parity bits (Parity_1) (or the second set of parity bits) and the third set of parity bits (Parity_2) and generate a second set of syndrome bits (Syndrome) based on the first set of parity bits (or the second set of parity bits) and the third set of parity bits. For example, the syndrome circuit 525 may XOR each parity bit in the first set of parity bits (or the second set of parity bits) with a corresponding parity bit in the third set of parity bits. The second set of syndrome bits may indicate whether the codeword has a second type of error (e.g., a link error).

The EDB circuit 530 may generate a second error detection bit (EDB_2) that indicates whether a second type of error (e.g., a link error) has been detected in the codeword. The EDB circuit 530 may generate the second error detection bit (EDB_2) based on the second set of syndrome bits. For example, the EDB circuit 530 may generate the second error detection bit by ORing the second set of syndrome bits. The second error detection bit may be a logic 0 (EDB_2=0) if the codeword is free of link errors and may be a logic 1 (EDB_2=1) if the codeword has a link error.

In some examples, the EDB circuit 530 may include a quantity of logic gates, such as OR gates 540, that are configured to perform a logic operation (e.g., an OR operation) on the second set of syndrome bits. For example, if the second set of syndrome bits includes eight bits S0 through S7, OR gate A may perform an OR operation on syndrome bits S0 and S1, OR gate B may perform an OR operation on syndrome bits S2 and S3, OR gate C may perform an OR operation on syndrome bits S4 and S5, and OR gate D may perform an OR operation on syndrome bits S6 and S7. The OR gate E may perform an OR operation on the resulting bits from OR gate A and OR gate B; and the OR gate F may perform an OR operation on the resulting bits from OR gate C and OR gate D. The OR gate G may then generate the error detection bit by performing an OR operation on the resulting bits from OR gate E and OR gate F. Thus, the second set of syndrome bits may be effectively ORed together. Other configurations of logic gates to generate the error detection bit are contemplated and within the scope of the present disclosure.

The controller 535 may determine the error status of the codeword based on the error detection bits. For example, the controller 535 may use the first error detection bit (EDB_1) to determine whether the codeword had a correctable array error and may use the second error detection bit (EDB_2) to determine whether the codeword has a link error.

In some examples, the host device 510 may use Table 3 to determine the error status of the codeword. According to Table 3, the host device 510 may determine that the codeword is errorless if EDB_1=0 and EDB_2=0; the host device 510 may determine that the codeword has an uncorrectable link error if EDB_1=0 and EDB_2=1; the host device 510 may determine that the codeword had a corrected array error if EDB_1=1 and EDB_2=0; and the host device 510 may determine that the codeword has an uncorrectable error if EDB_1=1 and EDB_2=1.

TABLE 3

Error Status Mapping for Host-
Centric Technique, Second Option

| EDB_1 | EDB_2 | Error Status |
| --- | --- | --- |
| 0 | 0 | Errorless |
| 0 | 1 | Uncorrectable link error |
| 1 | 0 | Corrected array error |
| 1 | 1 | Uncorrectable error |

The host device 510 may initiate or perform one or more actions based on the error status of the codeword. For example, if the error status indicates that the data received by the host device is errorless, the host device 510 may process the data. If the error status indicates that the received data has an uncorrectable error of unknown origin, the host device may discard the data and enter a safety mode. If the error status indicates that the codeword had a correctable array error that the memory device 505 corrected, the host device may record the address associated with that codeword as part of an error-logging process for ensuring the reliability of the memory device 505. For example, the host device may retire (e.g., no longer use) a portion (e.g., a row) of memory if a threshold quantity of errors accumulate in the row. If the error status indicates that the received data has an uncorrectable link error, the host device 510 may re-transmit the read command for the data. Other actions by the host device are contemplated and within the scope of the present disclosure.

In some examples, aspects of the system 400 and the system 500 may be combined so that the resulting system is able to support, and switch between, the first option and the second option for the host-centric technique. For example, the EDB circuit 530 may be added to the system 500 (e.g., after the syndrome circuit 435) so that the system can implement the first option in some scenarios and implement the second option in other scenarios. For example, if error correction is prioritized over diagnostic coverage for multi-bit errors, the system may implement the first option (which supports link error correction but has reduced detection of multi-bit errors relative to the second option). If diagnostic coverage for multi-bit errors is prioritized over error correction, the system may implement the second option (which has improved detection of multi-bit errors relative to the second option but does not support link error correction).

Thus, the system 500 may implement the second option for the host-centric technique to detect and classify errors in a codeword.

Figure 6:
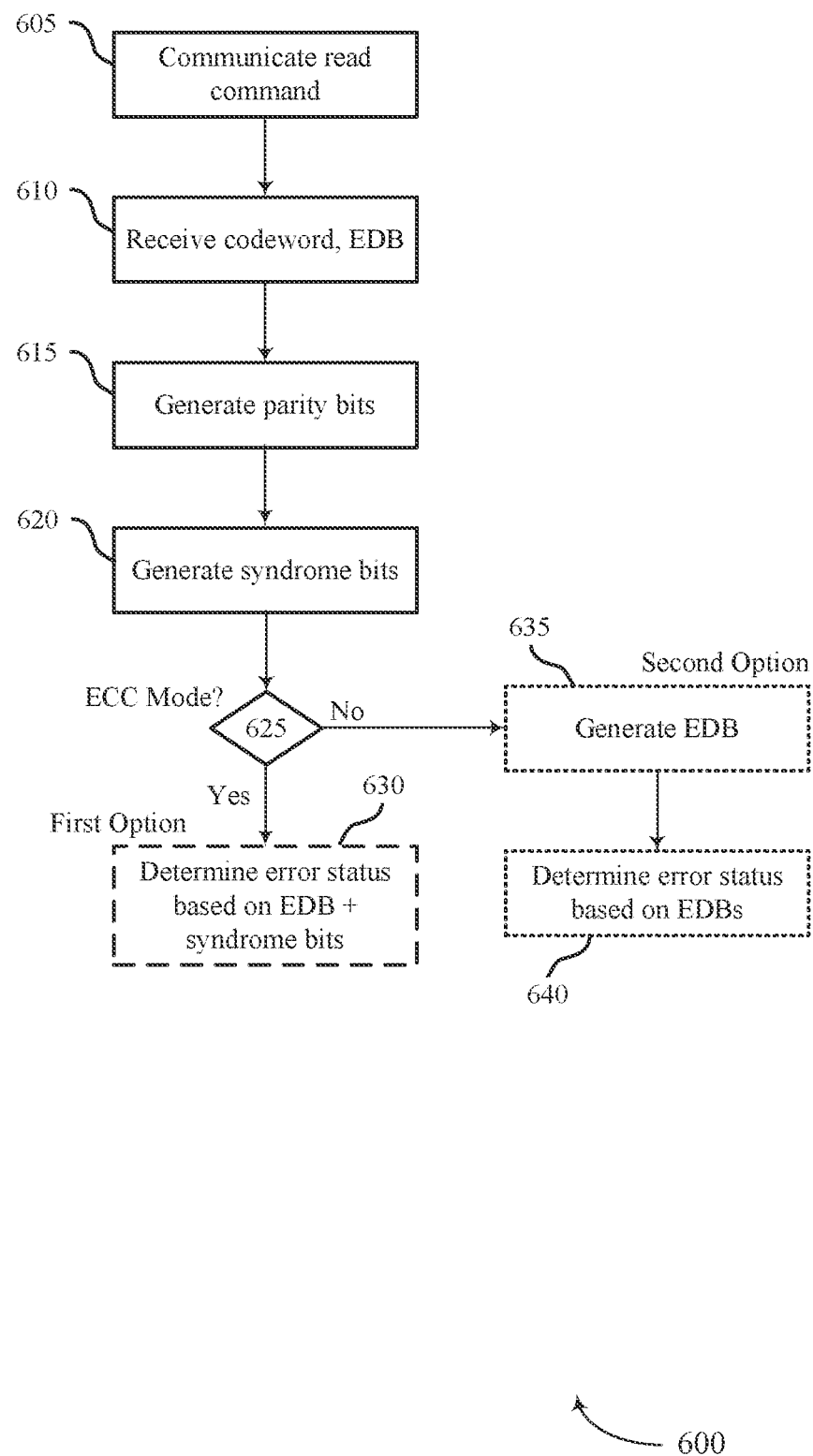
FIG. 6 illustrates an example of a process flow that supports error detection and classification in accordance with examples as disclosed herein.

FIG. 6 illustrates an example of a process flow 600 that supports error detection and classification in accordance with examples as disclosed herein. Aspects of the process flow 600 may be implemented by a host device as described herein. For example, aspects of the process flow 600 may be implemented by the host device 410 or the host device 510 as described with reference to FIGS. 4 and 5, which may be configured to support the host-centric technique. By implementing aspects of the process flow 600, the host device may determine the error status for a codeword associated with data requested by a host device.

At 605, the host device may communicate a read command for a codeword stored at a memory device. At 610, the host device may receive (e.g., from the memory device) the codeword and a first error detection bit for the codeword. The host device may receive the codeword and the first error detection bit based on (e.g., in response to) communicating the read command. The codeword may include data bits and a first set of parity bits.

At 615, the host device may generate a second set of parity bits for the codeword. The host device may generate the second set of parity bits based on the data bits in the codeword. At 620, the host device may generate a set of syndrome bits for the codeword. The set of syndrome bits may be generated based on the first set of parity bits and the second set of parity bits.

At 625, the host device may determine whether the host device is operating in an ECC mode or an EDC mode. If the host device is operating in the ECC mode, the host device may proceed to 630 and determine the error status of the codeword based on the error detection bit received from the memory device and the set of syndrome bits generated by the host device. If the host device is operating in the EDC mode, the host device may proceed to 635 and generate a second error detection bit for the codeword based on the set of syndrome bits. At 640, The host device may determine the error status of the codeword based on the error detection bit received from the memory device and the error detection bit generated by the host device.

Thus, the host device may determine the error status for the codeword. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 7:
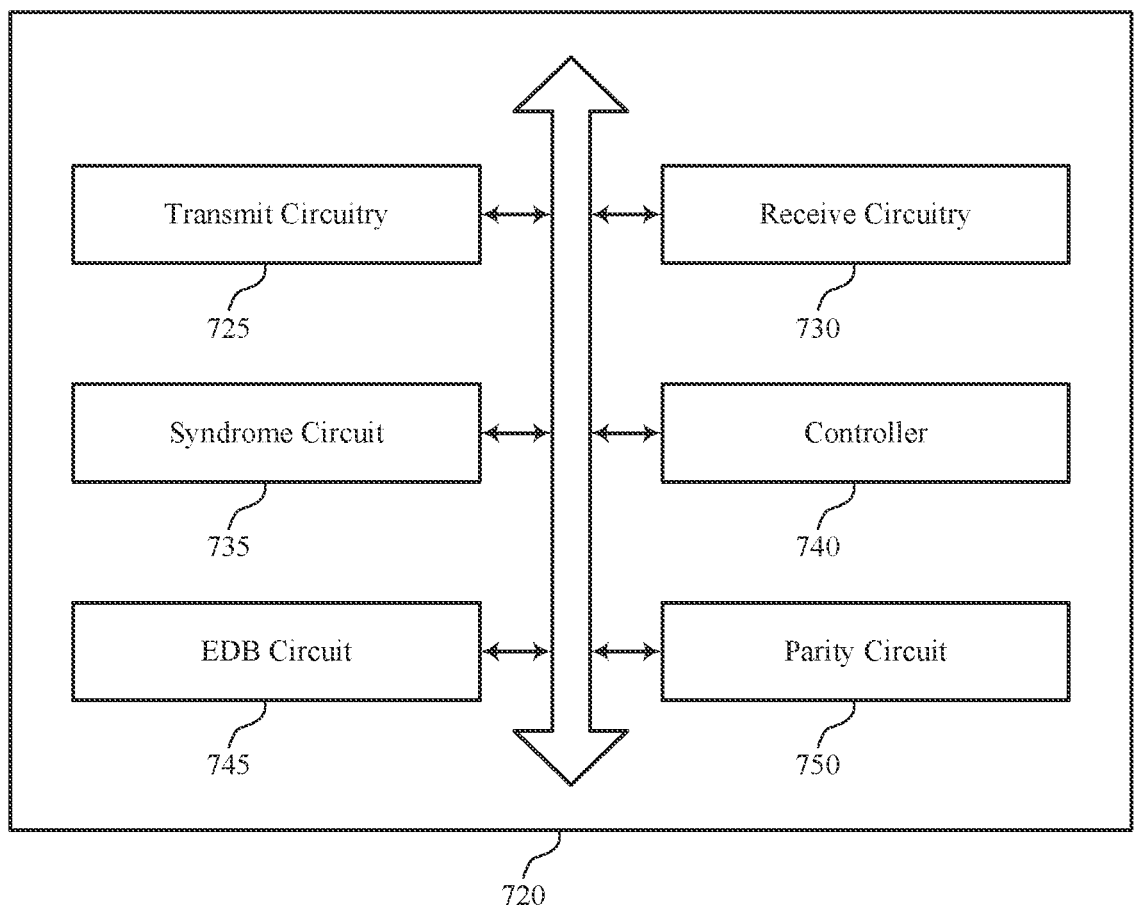
FIG. 7 shows a block diagram of a host device that supports error detection and classification in accordance with examples as disclosed herein.

FIG. 7 shows a block diagram 700 of a host device 720 that supports error detection and classification at a host device in accordance with examples as disclosed herein. The host device 720 may be an example of aspects of a host device as described with reference to FIGS. 1 through 6. The host device 720, or various components thereof, may be an example of means for performing various aspects of error detection and classification at a host device as described herein. For example, the host device 720 may include a transmit circuitry 725, a receive circuitry 730, a syndrome circuit 735, a controller 740, a EDB circuit 745, a parity circuit 750, or any combination thereof. Each of these components may communicate, directly or indirectly, with one another (e.g., via one or more buses).

The transmit circuitry 725 may be configured as or otherwise support a means for communicating, from a host device, a read command for a codeword stored at a memory device. The receive circuitry 730 may be configured as or otherwise support a means for receiving, at the host device based at least in part on communicating the read command, the codeword and an error detection bit that indicates whether the memory device detected a first type of error in the codeword. The syndrome circuit 735 may be configured as or otherwise support a means for generating, by the host device, syndrome bits for the received codeword that indicate whether the codeword has a second type of error. The controller 740 may be configured as or otherwise support a means for determining, by the host device, an error status of the codeword based at least in part on the error detection bit received from the memory device and the syndrome bits generated by the host device.

In some examples, the first type of error includes an array error that is associated with storage of the codeword in memory. In some examples, the second type of error includes a link error associated with propagation of the codeword between the memory device and the host device.

In some examples, the codeword includes data bits and a first set of parity bits, and the parity circuit 750 may be configured as or otherwise support a means for generating a second set of parity bits based at least in part on the data bits, where the syndrome bits are generated based at least in part on the first set of parity bits and the second set of parity bits.

In some examples, the syndrome circuit 735 may be configured as or otherwise support a means for performing a logic operation on the first set of parity bits and the second set of parity bits, where the syndrome bits are generated based at least in part on performing the logic operation.

In some examples, the receive circuitry 730 may be configured as or otherwise support a means for receiving, from the memory device, a bit that indicates whether the codeword has an even or odd quantity of logic ones, where the error status is determined based at least in part on the bit.

In some examples, to support determining the error status, the controller 740 may be configured as or otherwise support a means for determining that the codeword is errorless based at least in part on the error detection bit indicating that the memory device did not detect the first type of error in the codeword and on the syndrome bits indicating that the codeword does not have the second type of error.

In some examples, to support determining the error status, the controller 740 may be configured as or otherwise support a means for determining that the codeword has an uncorrectable error of the second type based at least in part on the error detection bit indicating that the memory device did not detect the first type of error in the codeword and on the syndrome bits indicating that the codeword has multiple errors of the second type.

In some examples, to support determining the error status, the controller 740 may be configured as or otherwise support a means for determining that the codeword had a correctable error of the first type based at least in part on the error detection bit indicating that the memory device detected the first type of error in the codeword and on the syndrome bits indicating that the codeword does not have the second type of error.

In some examples, to support determining the error status, the controller 740 may be configured as or otherwise support a means for determining that the codeword has a correctable error of the second type based at least in part on the error detection bit indicating that the memory device did not detect the first type of error in the codeword and on the syndrome bits indicating that the codeword has a single-bit error of the second type.

In some examples, to support determining the error status, the controller 740 may be configured as or otherwise support a means for determining that the codeword has an uncorrectable error based at least in part on the error detection bit indicating that the memory device detected the first type of error in the codeword and on the syndrome bits indicating that the codeword has the second type of error.

In some examples, the transmit circuitry 725 may be configured as or otherwise support a means for communicating, from a host device, a read command for a codeword stored at a memory device. In some examples, the receive circuitry 730 may be configured as or otherwise support a means for receiving, at the host device, a first error detection bit that is based at least in part a first set of syndrome bits for the codeword, where the first error detection bit indicates whether the memory device detected a first type of error in the codeword. The EDB circuit 745 may be configured as or otherwise support a means for generating, by the host device, a second error detection bit based at least in part on a second set of syndrome bits for the codeword, where the second error detection bit indicates whether the host device detected a second type of error in the codeword. In some examples, the controller 740 may be configured as or otherwise support a means for determining, by the host device, an error status for the codeword based at least in part on the first error detection bit and the second error detection bit.

In some examples, the first type of error includes an array error that is associated with storage of the codeword in memory. In some examples, the second type of error includes a link error that is associated with propagation of the codeword between the memory device and the host device.

In some examples, the codeword includes data bits and a first set of parity bits, and the parity circuit 750 may be configured as or otherwise support a means for generating a second set of parity bits based at least in part on the data bits. In some examples, the codeword includes data bits and a first set of parity bits, and the syndrome circuit 735 may be configured as or otherwise support a means for generating the second set of syndrome bits based at least in part on the first set of panty bits and the second set of parity bits.

In some examples, the syndrome circuit 735 may be configured as or otherwise support a means for performing a logic operation on the first set of parity bits and the second set of parity bits, where the second set of syndrome bits are generated based at least in part on performing the logic operation.

In some examples, the EDB circuit 745 may be configured as or otherwise support a means for performing a logic operation on the second set of syndrome bits, where the second error detection bit is based at least in part on performing the logic operation.

In some examples, to support determining the error status, the controller 740 may be configured as or otherwise support a means for determining that the codeword is errorless based at least in part on the first error detection bit indicating that the memory device did not detect the first type of error in the codeword and on the second error detection bit indicating that the host device did not detect the second type of error in the codeword.

In some examples, to support determining the error status, the controller 740 may be configured as or otherwise support a means for determining that the codeword has the second type of error based at least in part on the first error detection bit indicating that the memory device did not detect the first type of error in the codeword and on the second error detection bit indicating that the host device detected the second type of error in the codeword.

In some examples, to support determining the error status, the controller 740 may be configured as or otherwise support a means for determining that the codeword had the second type of error based at least in part on the first error detection bit indicating that the memory device detected the second type of error in the codeword and on the second error detection bit indicating that the host device did not detect the first type of error in the codeword.

In some examples, to support determining the error status, the controller 740 may be configured as or otherwise support a means for determining that the codeword has an uncorrectable error based at least in part on the first error detection bit indicating that the memory device detected the first type of error in the codeword and on the second error detection bit indicating that the host device detected the second type of error in the codeword.

The syndrome circuit 735, the EDB circuit 745, and/or the parity circuit 750 may include one or more circuits that includes logic components (e.g., OR gates, XOR gates, NOR gate, AND gates, inverters, NAND gates, NOT gates, XNOR gates), controllers, electrical components (e.g., transistors, resistors, operational amplifiers, capacitors, inductors, diodes, switches), and the like.

Figure 8:
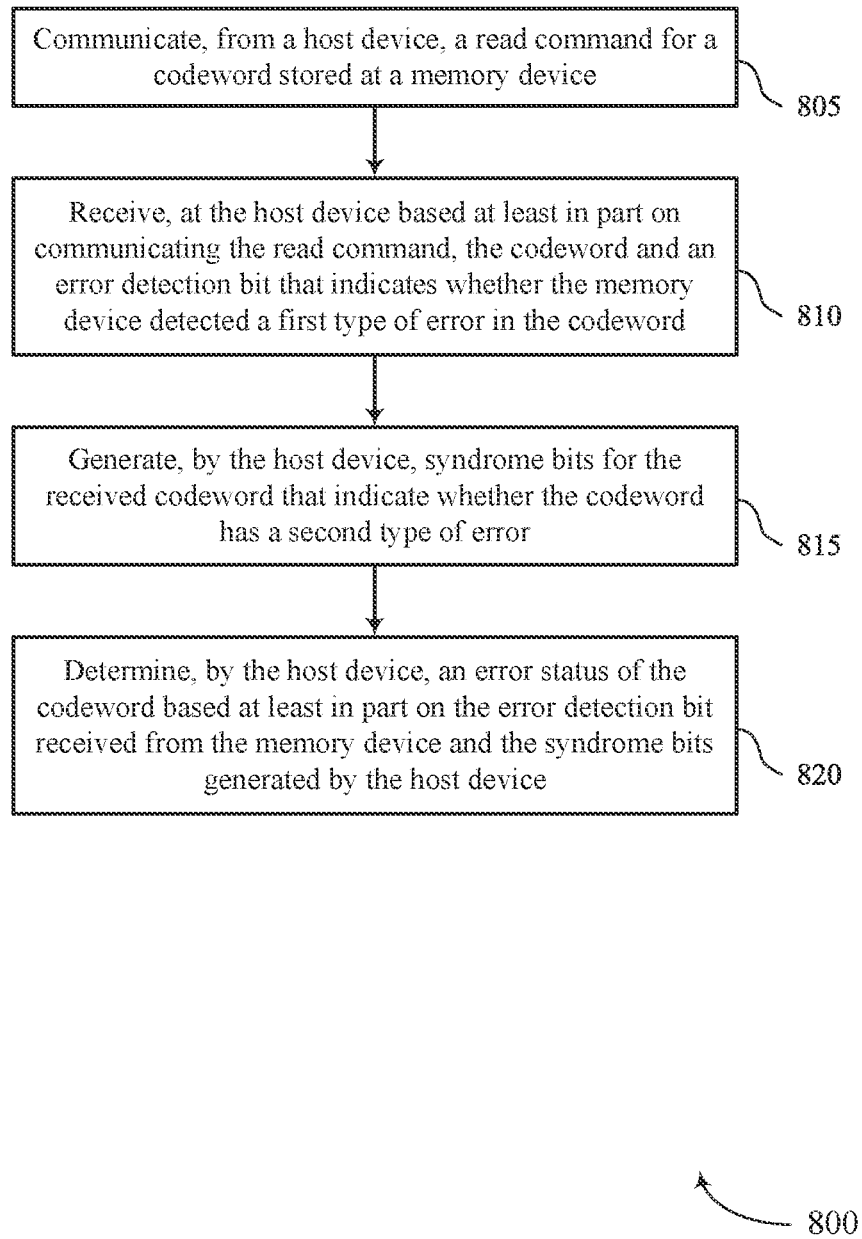
FIGS. 8 and 9 show flowcharts illustrating a method or methods that support error detection and classification at a host device in accordance with examples as disclosed herein.

FIG. 8 shows a flowchart illustrating a method 800 that supports error detection and classification at a host device in accordance with examples as disclosed herein. The operations of method 800 may be implemented by a host device or its components as described herein. For example, the operations of method 800 may be performed by a host device as described with reference to FIGS. 1 through 7. In some examples, a host device may execute a set of instructions to control the functional elements of the device to perform the described functions. Additionally, or alternatively, the host device may perform aspects of the described functions using special-purpose hardware.

At 805, the method may include communicating, from a host device, a read command for a codeword stored at a memory device. The operations of 805 may be performed in accordance with examples as disclosed herein. In some examples, aspects of the operations of 805 may be performed by a transmit circuitry 725 as described with reference to FIG. 7.

At 810, the method may include receiving, at the host device based at least in part on communicating the read command, the codeword and an error detection bit that indicates whether the memory device detected a first type of error in the codeword. The operations of 810 may be performed in accordance with examples as disclosed herein. In some examples, aspects of the operations of 810 may be performed by a receive circuitry 730 as described with reference to FIG. 7.

At 815, the method may include generating, by the host device, syndrome bits for the received codeword that indicate whether the codeword has a second type of error. The operations of 815 may be performed in accordance with examples as disclosed herein. In some examples, aspects of the operations of 815 may be performed by a syndrome circuit 735 as described with reference to FIG. 7.

At 820, the method may include determining, by the host device, an error status of the codeword based at least in part on the error detection bit received from the memory device and the syndrome bits generated by the host device. The operations of 820 may be performed in accordance with examples as disclosed herein. In some examples, aspects of the operations of 820 may be performed by a controller 740 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for communicating, from a host device, a read command for a codeword stored at a memory device; receiving, at the host device based at least in part on communicating the read command, the codeword and an error detection bit that indicates whether the memory device detected a first type of error in the codeword; generating, by the host device, syndrome bits for the received codeword that indicate whether the codeword has a second type of error; and determining, by the host device, an error status of the codeword based at least in part on the error detection bit received from the memory device and the syndrome bits generated by the host device.

Aspect 2: The method, apparatus, or non-transitory computer-readable medium of aspect 1, where the first type of error includes an array error that is associated with storage of the codeword in memory and the second type of error includes a link error associated with propagation of the codeword between the memory device and the host device.

Aspect 3: The method, apparatus, or non-transitory computer-readable medium of any of aspects 1 through 2, where the codeword includes data bits and a first set of parity bits and the method, apparatuses, and non-transitory computer-readable medium further includes operations, features, circuitry, logic, means, or instructions, or any combination thereof for generating a second set of parity bits based at least in part on the data bits, where the syndrome bits are generated based at least in part on the first set of parity bits and the second set of parity bits.

Aspect 4: The method, apparatus, or non-transitory computer-readable medium of aspect 3, further including operations, features, circuitry, logic, means, or instructions, or any combination thereof for performing a logic operation on the first set of parity bits and the second set of parity bits, where the syndrome bits are generated based at least in part on performing the logic operation.

Aspect 5: The method, apparatus, or non-transitory computer-readable medium of any of aspects 1 through 4, further including operations, features, circuitry, logic, means, or instructions, or any combination thereof for receiving, from the memory device, a bit that indicates whether the codeword has an even or odd quantity of logic ones, where the error status is determined based at least in part on the bit.

Aspect 6: The method, apparatus, or non-transitory computer-readable medium of any of aspects 1 through 5, where determining the error status includes operations, features, circuitry, logic, means, or instructions, or any combination thereof for determining that the codeword is errorless based at least in part on the error detection bit indicating that the memory device did not detect the first type of error in the codeword and on the syndrome bits indicating that the codeword does not have the second type of error.

Aspect 7: The method, apparatus, or non-transitory computer-readable medium of any of aspects 1 through 6, where determining the error status includes operations, features, circuitry, logic, means, or instructions, or any combination thereof for determining that the codeword has an uncorrectable error of the second type based at least in part on the error detection bit indicating that the memory device did not detect the first type of error in the codeword and on the syndrome bits indicating that the codeword has multiple errors of the second type.

Aspect 8. The method, apparatus, or non-transitory computer-readable medium of any of aspects 1 through 7, where determining the error status includes operations, features, circuitry, logic, means, or instructions, or any combination thereof for determining that the codeword had a correctable error of the first type based at least in part on the error detection bit indicating that the memory device detected the first type of error in the codeword and on the syndrome bits indicating that the codeword does not have the second type of error.

Aspect 9: The method, apparatus, or non-transitory computer-readable medium of any of aspects 1 through 8, where determining the error status includes operations, features, circuitry, logic, means, or instructions, or any combination thereof for determining that the codeword has a correctable error of the second type based at least in part on the error detection bit indicating that the memory device did not detect the first type of error in the codeword and on the syndrome bits indicating that the codeword has a single-bit error of the second type.

Aspect 10: The method, apparatus, or non-transitory computer-readable medium of any of aspects 1 through 9, where determining the error status includes operations, features, circuitry, logic, means, or instructions, or any combination thereof for determining that the codeword has an uncorrectable error based at least in part on the error detection bit indicating that the memory device detected the first type of error in the codeword and on the syndrome bits indicating that the codeword has the second type of error.

Figure 9:
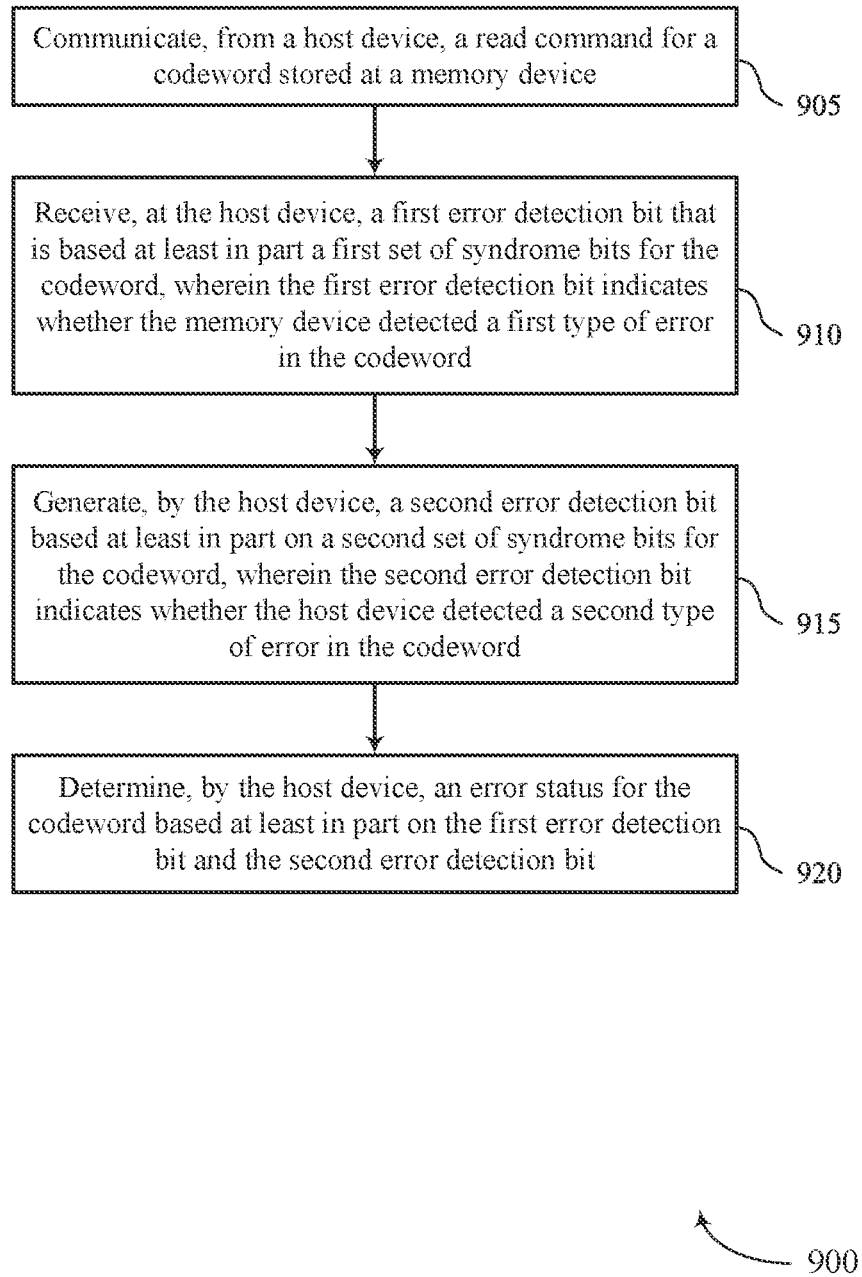

FIG. 9 shows a flowchart illustrating a method 900 that supports error detection and classification at a host device in accordance with examples as disclosed herein. The operations of method 900 may be implemented by a host device or its components as described herein. For example, the operations of method 900 may be performed by a host device as described with reference to FIGS. 1 through 7. In some examples, a host device may execute a set of instructions to control the functional elements of the device to perform the described functions. Additionally, or alternatively, the host device may perform aspects of the described functions using special-purpose hardware.

At 905, the method may include communicating, from a host device, a read command for a codeword stored at a memory device. The operations of 905 may be performed in accordance with examples as disclosed herein. In some examples, aspects of the operations of 905 may be performed by a transmit circuitry 725 as described with reference to FIG. 7.

At 910, the method may include receiving, at the host device, a first error detection bit that is based at least in part a first set of syndrome bits for the codeword, where the first error detection bit indicates whether the memory device detected a first type of error in the codeword. The operations of 910 may be performed in accordance with examples as disclosed herein. In some examples, aspects of the operations of 910 may be performed by a receive circuitry 730 as described with reference to FIG. 7.

At 915, the method may include generating, by the host device, a second error detection bit based at least in part on a second set of syndrome bits for the codeword, where the second error detection bit indicates whether the host device detected a second type of error in the codeword. The operations of 915 may be performed in accordance with examples as disclosed herein. In some examples, aspects of the operations of 915 may be performed by a EDB circuit 745 as described with reference to FIG. 7.

At 920, the method may include determining, by the host device, an error status for the codeword based at least in part on the first error detection bit and the second error detection bit. The operations of 920 may be performed in accordance with examples as disclosed herein. In some examples, aspects of the operations of 920 may be performed by a controller 740 as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for communicating, from a host device, a read command for a codeword stored at a memory device; receiving, at the host device, a first error detection bit that is based at least in part a first set of syndrome bits for the codeword, where the first error detection bit indicates whether the memory device detected a first type of error in the codeword; generating, by the host device, a second error detection bit based at least in part on a second set of syndrome bits for the codeword, where the second error detection bit indicates whether the host device detected a second type of error in the codeword; and determining, by the host device, an error status for the codeword based at least in part on the first error detection bit and the second error detection bit.

Aspect 12: The method, apparatus, or non-transitory computer-readable medium of aspect 11, where the first type of error includes an array error that is associated with storage of the codeword in memory and the second type of error includes a link error that is associated with propagation of the codeword between the memory device and the host device.

Aspect 13: The method, apparatus, or non-transitory computer-readable medium of any of aspects 11 through 12, where the codeword includes data bits and a first set of parity bits and the method, apparatuses, and non-transitory computer-readable medium further includes operations, features, circuitry, logic, means, or instructions, or any combination thereof for generating a second set of parity bits based at least in part on the data bits and generating the second set of syndrome bits based at least in part on the first set of parity bits and the second set of parity bits.

Aspect 14: The method, apparatus, or non-transitory computer-readable medium of aspect 13, further including operations, features, circuitry, logic, means, or instructions, or any combination thereof for performing a logic operation on the first set of parity bits and the second set of parity bits, where the second set of syndrome bits are generated based at least in part on performing the logic operation.

Aspect 15: The method, apparatus, or non-transitory computer-readable medium of any of aspects 11 through 14, further including operations, features, circuitry, logic, means, or instructions, or any combination thereof for performing a logic operation on the second set of syndrome bits, where the second error detection bit is based at least in part on performing the logic operation.

Aspect 16: The method, apparatus, or non-transitory computer-readable medium of any of aspects 11 through 15, where determining the error status includes operations, features, circuitry, logic, means, or instructions, or any combination thereof for determining that the codeword is errorless based at least in part on the first error detection bit indicating that the memory device did not detect the first type of error in the codeword and on the second error detection bit indicating that the host device did not detect the second type of error in the codeword.

Aspect 17: The method, apparatus, or non-transitory computer-readable medium of any of aspects 11 through 16, where determining the error status includes operations, features, circuitry, logic, means, or instructions, or any combination thereof for determining that the codeword has the second type of error based at least in part on the first error detection bit indicating that the memory device did not detect the first type of error in the codeword and on the second error detection bit indicating that the host device detected the second type of error in the codeword.

Aspect 18: The method, apparatus, or non-transitory computer-readable medium of any of aspects 11 through 17, where determining the error status includes operations, features, circuitry, logic, means, or instructions, or any combination thereof for determining that the codeword had the second type of error based at least in part on the first error detection bit indicating that the memory device detected the second type of error in the codeword and on the second error detection bit indicating that the host device did not detect the first type of error in the codeword.

Aspect 19: The method, apparatus, or non-transitory computer-readable medium of any of aspects 11 through 18, where determining the error status includes operations, features, circuitry, logic, means, or instructions, or any combination thereof for determining that the codeword has an uncorrectable error based at least in part on the first error detection bit indicating that the memory device detected the first type of error in the codeword and on the second error detection bit indicating that the host device detected the second type of error in the codeword.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 20: An apparatus, including: a host device coupled with a memory device; and a controller within the host device and configured to cause the host device to: communicate a read command for a codeword stored at the memory device; receive, based at least in part on communicating the read command, the codeword and an error detection bit that indicates whether the memory device detected a first type of error in the codeword; generate syndrome bits for the received codeword that indicate whether the codeword has a second type of error; and determine an error status of the codeword based at least in part on the error detection bit received from the memory device and the syndrome bits generated by the host device.

Aspect 21: The apparatus of aspect 20, where the codeword includes data bits and a first set of parity bits, and where the controller is further configured to cause the host device to: generate a second set of parity bits based at least in part on the data bits, where the syndrome bits are generated based at least in part on the first set of parity bits and the second set of parity bits.

Aspect 22: The apparatus of aspect 21, where the controller is further configured to cause the host device to: perform a logic operation on the first set of parity bits and the second set of parity bits, where the syndrome bits are generated based at least in part on performing the logic operation.

Aspect 23: The apparatus of any of aspects 20 through 22, where the controller is further configured to cause the host device to: receive, from the memory device, a bit that indicates whether the codeword has an even or odd quantity of logic ones, where the error status is determined based at least in part on the bit.

An apparatus is described. The following provides an overview of aspects of the apparatus as described herein:

Aspect 24: An apparatus, including: a host device coupled with a memory device; and a controller within the host device and configured to cause the host device to: communicate a read command for a codeword stored at the memory device; receive a first error detection bit that is based at least in part a first set of syndrome bits for the codeword, where the first error detection bit indicates whether the memory device detected a first type of error in the codeword; generate a second error detection bit based at least in part on a second set of syndrome bits for the codeword, where the second error detection bit indicates whether the host device detected a second type of error in the codeword; and determine an error status for the codeword based at least in part on the first error detection bit and the second error detection bit.

Aspect 25: The apparatus of aspect 24, where the codeword includes data bits and a first set of parity bits, and where the controller is further configured to cause the host device to: generate a second set of parity bits based at least in part on the data bits; and generate the second set of syndrome bits based at least in part on the first set of parity bits and the second set of parity bits.

Aspect 26: The apparatus of aspect 25, where the controller is further configured to cause the host device to: perform a logic operation on the first set of parity bits and the second set of parity bits, where the second set of syndrome bits are generated based at least in part on performing the logic operation.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   communicating, from a host device, a read command for a codeword stored at a memory device;
   receiving, at the host device based at least in part on communicating the read command, the codeword and an error detection bit that indicates whether the memory device detected a first type of error in the codeword;
   generating, by the host device based at least in part on a first set of parity bits received from the memory device and on a second set of parity bits generated by the host device, syndrome bits for the received codeword that indicate whether the codeword has a second type of error; and
   determining, by the host device, an error status of the codeword based at least in part on the error detection bit received from the memory device and the syndrome bits generated by the host device.

2. The method of claim 1, wherein the first type of error comprises an array error that is associated with storage of the codeword in memory, and wherein the second type of error comprises a link error associated with propagation of the codeword between the memory device and the host device.

3. The method of claim 1, wherein the codeword comprises data bits and the first set of parity bits, the method further comprising:
   generating the second set of parity bits based at least in part on the data bits.

4. The method of claim 3, further comprising:
   performing a logic operation on the first set of parity bits and the second set of parity bits, wherein the syndrome bits are generated based at least in part on performing the logic operation.

5. The method of claim 1, further comprising:
   receiving, from the memory device, a bit that indicates whether the codeword has an even or odd quantity of logic ones, wherein the error status is determined based at least in part on the bit.

6. The method of claim 1, wherein determining the error status comprises:
   determining that the codeword is errorless based at least in part on the error detection bit indicating that the memory device did not detect the first type of error in the codeword and on the syndrome bits indicating that the codeword does not have the second type of error.

7. The method of claim 1, wherein determining the error status comprises:
   determining that the codeword has an uncorrectable error of the second type based at least in part on the error detection bit indicating that the memory device did not detect the first type of error in the codeword and on the syndrome bits indicating that the codeword has multiple errors of the second type.

8. The method of claim 1, wherein determining the error status comprises:
   determining that the codeword had a correctable error of the first type based at least in part on the error detection bit indicating that the memory device detected the first type of error in the codeword and on the syndrome bits indicating that the codeword does not have the second type of error.

9. The method of claim 1, wherein determining the error status comprises:
   determining that the codeword has a correctable error of the second type based at least in part on the error detection bit indicating that the memory device did not detect the first type of error in the codeword and on the syndrome bits indicating that the codeword has a single-bit error of the second type.

10. The method of claim 1, wherein determining the error status comprises:
determining that the codeword has an uncorrectable error based at least in part on the error detection bit indicating that the memory device detected the first type of error in the codeword and on the syndrome bits indicating that the codeword has the second type of error.

11. A method, comprising:
receiving, by a host device, a codeword from a memory device, wherein the codeword comprises data bits and a first set of parity bits;
receiving, at the host device, a first error detection bit that is based at least in part a first set of syndrome bits for the codeword, wherein the first error detection bit indicates whether the memory device detected a first type of error in the codeword;
generating a second set of parity bits based at least in part on the data bits;
generating a second set of syndrome bits based at least in part on the first set of parity bits and the second set of parity bits;
generating, by the host device, a second error detection bit based at least in part on the second set of syndrome bits for the codeword, wherein the second error detection bit indicates whether the host device detected a second type of error in the codeword; and
determining, by the host device, an error status for the codeword based at least in part on the first error detection bit and the second error detection bit.

12. The method of claim 11, wherein the first type of error comprises an array error that is associated with storage of the codeword in memory, and wherein the second type of error comprises a link error that is associated with propagation of the codeword between the memory device and the host device.

13. The method of claim 11, further comprising:
performing a logic operation on the first set of parity bits and the second set of parity bits, wherein the second set of syndrome bits are generated based at least in part on performing the logic operation.

14. The method of claim 11, further comprising:
performing a logic operation on the second set of syndrome bits, wherein the second error detection bit is based at least in part on performing the logic operation.

15. The method of claim 11, wherein determining the error status comprises:
determining that the codeword is errorless based at least in part on the first error detection bit indicating that the memory device did not detect the first type of error in the codeword and on the second error detection bit indicating that the host device did not detect the second type of error in the codeword.

16. The method of claim 11, wherein determining the error status comprises:
determining that the codeword has the second type of error based at least in part on the first error detection bit indicating that the memory device did not detect the first type of error in the codeword and on the second error detection bit indicating that the host device detected the second type of error in the codeword.

17. The method of claim 11, wherein determining the error status comprises:
determining that the codeword had the second type of error based at least in part on the first error detection bit indicating that the memory device detected the second type of error in the codeword and on the second error detection bit indicating that the host device did not detect the first type of error in the codeword.

18. The method of claim 11, wherein determining the error status comprises:
determining that the codeword has an uncorrectable error based at least in part on the first error detection bit indicating that the memory device detected the first type of error in the codeword and on the second error detection bit indicating that the host device detected the second type of error in the codeword.

19. An apparatus, comprising:
a host device coupled with a memory device; and
a controller within the host device and configured to cause the host device to:
communicate a read command for a codeword stored at the memory device;
receive, based at least in part on communicating the read command, the codeword and an error detection bit that indicates whether the memory device detected a first type of error in the codeword;
generate, based at least in part on a first set of parity bits received from the memory device and on a second set of parity bits generated by the host device, syndrome bits for the received codeword that indicate whether the codeword has a second type of error; and
determine an error status of the codeword based at least in part on the error detection bit received from the memory device and the syndrome bits generated by the host device.

20. The apparatus of claim 19, wherein the codeword comprises data bits and the first set of parity bits, and wherein the controller is further configured to cause the host device to:
generate the second set of parity bits based at least in part on the data bits.

21. The apparatus of claim 20, wherein the controller is further configured to cause the host device to:
perform a logic operation on the first set of parity bits and the second set of parity bits, wherein the syndrome bits are generated based at least in part on performing the logic operation.

22. The apparatus of claim 19, wherein the controller is further configured to cause the host device to:
receive, from the memory device, a bit that indicates whether the codeword has an even or odd quantity of logic ones, wherein the error status is determined based at least in part on the bit.

23. An apparatus, comprising:
a host device coupled with a memory device; and
a controller within the host device and configured to cause the host device to:
receive a codeword from the memory device, wherein the codeword comprises data bits and a first set of parity bits;
receive a first error detection bit that is based at least in part a first set of syndrome bits for the codeword, wherein the first error detection bit indicates whether the memory device detected a first type of error in the codeword;
generating a second set of parity bits based at least in part on the data bits;
generating a second set of syndrome bits based at least in part on the first set of parity bits and the second set of parity bits;

generate a second error detection bit based at least in part on the second set of syndrome bits for the codeword, wherein the second error detection bit indicates whether the host device detected a second type of error in the codeword; and determine an error status for the codeword based at least in part on the first error detection bit and the second error detection bit.

24. The apparatus of claim 23, wherein the controller is further configured to cause the host device to:

perform a logic operation on the first set of parity bits and the second set of parity bits, wherein the second set of syndrome bits are generated based at least in part on performing the logic operation.

* * * * *